(12) United States Patent
Barth et al.

(10) Patent No.: US 7,635,908 B2
(45) Date of Patent: Dec. 22, 2009

(54) CORRESPONDING CAPACITOR ARRANGEMENT AND METHOD FOR MAKING THE SAME

(75) Inventors: Hans-Joachim Barth, Munich (DE); Helmut Tews, Munich (DE)

(73) Assignee: Infineon Technologies AG, Munich (DE)

( * ) Notice: Subject to any disclaimer, the term of this patent is extended or adjusted under 35 U.S.C. 154(b) by 143 days.

(21) Appl. No.: 11/652,157

(22) Filed: Jan. 11, 2007

(65) Prior Publication Data
US 2007/0155090 A1 Jul. 5, 2007

Related U.S. Application Data

(63) Continuation of application No. PCT/EP2005/052920, filed on Jun. 22, 2005.

(51) Int. Cl.
*H01L 29/00* (2006.01)
(52) U.S. Cl. .............................. 257/532; 257/E27.048
(58) Field of Classification Search ................ 257/307, 257/532, 534, E27.048
See application file for complete search history.

(56) References Cited

U.S. PATENT DOCUMENTS 5,939,766 A * 8/1999 Stolmeijer et al. .......... 257/534

| | | | |
|---|---|---|---|
| 6,228,707 B1 * | 5/2001 | Lin | 438/250 |
| 6,451,667 B1 | 9/2002 | Ning | |
| 6,620,701 B2 * | 9/2003 | Ning | 438/396 |
| 6,624,040 B1 | 9/2003 | Ng et al. | |
| 2002/0058394 A1 | 5/2002 | Holmes et al. | |
| 2002/0081832 A1 | 6/2002 | Bernstein et al. | |

FOREIGN PATENT DOCUMENTS

| DE | 10247454 | 5/2003 |
|---|---|---|
| DE | 10257669 | 7/2003 |

* cited by examiner

*Primary Examiner*—Mark Prenty
(74) *Attorney, Agent, or Firm*—Brinks Hofer Gilson & Lione

(57) ABSTRACT

The invention relates to a method for producing a capacitor arrangement, and to a corresponding capacitor arrangement, wherein the first insulating layer is formed at the surface of a carrier substrate and a first capacitor electrode with a multiplicity of interspaced first interconnects is produced in said insulating layer. Using a mask layer, partial regions of the first insulating layer are removed for the purpose of uncovering the multiplicity of first interconnects, and after the formation of a capacitor dielectric at the surface of the uncovered first interconnects, a second capacitor electrode is formed with a multiplicity of interspaced second interconnects lying between the first interconnects coated with capacitor dielectric. This additionally simplified production method enables self-aligning and cost-effective production of capacitors having a high capacitance per unit area and mechanical stability.

6 Claims, 5 Drawing Sheets

CORRESPONDING CAPACITOR ARRANGEMENT AND METHOD FOR MAKING THE SAME

This application is a continuation of International Application No. PCT/EP2005/052920 filed Jun. 22, 2005, which claims priority to German Patent Application DE 10 2004 033 825.6 filed Jul. 13, 2004, both of which are incorporated herein in their entirety by reference.

BACKGROUND OF THE INVENTION

1. Field of the Invention

The present invention relates to a method for producing a capacitor arrangement, and to a corresponding capacitor arrangement, in particular to a BEOL (Back End Of Line) MIMCap (Metal Insulator Metal Capacitor), such as is used in integrated semiconductor circuits.

2. Description of the Known Technology

In semiconductor fabrication a distinction is made, in principle, between two time segments, early processing or a front segment of a production line being referred to as FEOL (Front End Of Line) and temporally later processing of a semiconductor wafer or the back end of a production line being referred to as BEOL (Back End Of Line). At the FEOL, processes with high temperatures are performed here, generally active semiconductor components such as transistors being produced in a semiconductor substrate of a wafer for example by means of layer depositions, ion implantation, diffusion operations and annealing steps. At the BEOL, by contrast, methods with the lower temperature are carried out, the formation of a wiring typically being realized by a multiplicity of metalization levels.

BRIEF SUMMARY OF THE INVENTION

In this case, the present invention essentially relates to capacitor arrangements which are formed in such a BEOL environment or in the metalization levels of a semiconductor circuit. Various methods are possible for realizing such BEOL capacitors, in the simplest case, two metalization levels of the device wiring being used as a capacitor and the intervening interlayer dielectric (ILD) serving as a capacitor dielectric. What is disadvantageous in this case, on account of the large thicknesses of the interlayer dielectric of approximately 200 to 500 nanometers, is a very high amount of space taken up for realizing sufficiently high capacitances.

The document DE 102 47 454 A1 discloses a method for producing vertical/horizontal MIMCaps (Metal Insulator Metal Capacitor) which can be used to realize capacitor arrangements having a high capacitance per unit area. In this case, firstly a multiplicity of interspaced first interconnects are formed in an insulating layer for the purpose of realizing a first capacitor electrode and a second insulating layer is subsequently deposited at a surface of the first interconnects and the first insulating layer. Afterward, using a photoresist, a partial region of the second insulating layer is uncovered and the wafer is etched, thereby removing not only the second insulating layer but also the first insulating layer between the first interconnects for the purpose of uncovering the first interconnects. Finally, a thin capacitor dielectric is deposited over the whole area and the trenches uncovered between the first interconnects are filled with an electrically conductive material for the purpose of realizing a second capacitor electrode with vertical and horizontal capacitor regions. Although a capacitor arrangement having a high capacitance per unit area is obtained essentially in self-aligning fashion in this way, the production method is complicated and the capacitor arrangement is consequently expensive.

Therefore, the invention is based on the object of providing a method for producing a capacitor arrangement and a corresponding capacitor arrangement which enables simplified production and consequently cost-effective capacitor arrangements.

According to the invention, this object is achieved by means of the measures of patent claim 1 with regard to the production method and owing to the features of patent claim 10 with regard to the capacitor arrangement.

Accordingly, in the method according to the invention only a first insulating layer is formed at the surface of a carrier substrate and a first capacitor electrode with a multiplicity of interspaced first interconnects is subsequently produced in the first insulating layer. Afterward, for the purpose of uncovering at least partial regions of the first insulating layer between the multiplicity of first interconnects, a mask layer is formed and the uncovered partial regions of the first insulating layer are thereby removed for the purpose of uncovering the multiplicity of first interconnects, in particular the lateral areas thereof. After the removal of the mask layer, a capacitor dielectric is formed at least at the surface of the uncovered first interconnects and, finally, a second capacitor electrode is formed at the surface of the capacitor dielectric with a multiplicity of interspaced second interconnects lying between the first interconnects. The omission of at least one method step means that the production method is additionally simplified, whereby costs can be minimized.

Preferably, a bottom layer with an additional or integrated etching stop layer and a top layer are formed as first insulating layer, the first interconnects being formed as far as the etching stop layer in the top layer and, during removal, the uncovered partial regions of the top layer being completely removed as far as the etching stop layer. Both the formation of the interconnects and the removal of the top layer are simplified as a result, it furthermore being possible for the orientation of the first and second capacitor electrodes in a common plane to be realized in a highly accurate manner.

Preferably, a first connection region is formed for the first capacitor electrode, the width of which connection region is at least twice as large as a width of the first interconnects, whereby contact-connection of the capacitor electrodes is greatly simplified.

Furthermore, the first capacitor electrode may be formed in comb-shaped fashion with a peripheral interconnect surrounding the first interconnects, at least one partial section of the peripheral interconnect being at a distance from the first interconnects which is at least twice as large as a mutual distance between the first interconnects. As a result, in a self-aligning method, for the second capacitor electrode, too, it is possible to realize a second connection region for enabling improved contact-connection within a common metalization level. The structural height of the capacitor arrangement is furthermore minimal.

Preferably, the first and second capacitor electrodes are formed in a bottommost metalization level, at which a minimum feature size has the smallest dimensions within the various metalization levels and a particularly high capacitance per unit area thus results.

With regard to the capacitor arrangement, the first and second capacitor electrodes are preferably formed in a top layer of a first insulating layer, the top layer being formed on a bottom layer with an additional or integrated etching stop layer. The realization of highly accurate capacitances is thus made possible in a particularly cost-effective manner.

Further advantageous configurations of the invention are characterized in the further subclaims.

The invention is described in more detail below on the basis of an exemplary embodiment with reference to the drawing.

BRIEF DESCRIPTION OF THE DRAWINGS

FIGS. 1 to 5D also show simplified sectional views and associated plan views for illustrating a simplified and thus cost-effective production method for a BEOL capacitor arrangement according to the invention.

DETAILED DESCRIPTION OF THE INVENTION

In accordance with FIG. 1, firstly a first insulating layer 2 is formed over the whole area at the surface of a carrier substrate 1 and a multiplicity of depressions or trenches for a later first capacitor electrode are produced in an upper region of the first insulating layer 2 for example by means of a damascene method.

In this case, the carrier substrate 1 used is usually a semiconductor wafer which has been partly processed in an FEOL process and in which a multiplicity of semiconductor components such as e.g. transistors, etc. have already been formed. The topmost layer of the carrier substrate 1 may consequently constitute a first metalization level or an interlayer dielectric (ILD) lying thereon. Preferably, the layer levels illustrated in the figures are situated in one of the bottommost metalization levels or the so-called "1× levels", in which a minimum line width or feature size prevails and maximum capacitances per unit area can thus be realized. On the other hand, the levels illustrated for realizing the capacitor arrangement may also lie in the upper or a topmost metalization level such as e.g. so-called "4× levels", in which, although the feature sizes are significantly larger, a more relaxed wiring situation prevails as well.

Preferably, the first insulating layer 2 comprises a bottom layer 2A formed directly at the surface of the carrier substrate 1, in which case it either has an additional etching stop layer (not illustrated) or itself acts as an (integrated) etching stop layer, and a top layer 2D formed at the surface of the bottom layer 2A or the etching stop layer. For the case where an additional etching stop layer is used between the bottom layer 2A and the top layer 2B, which is composed of SiC, for example, an identical dielectric material can be used for the bottom layer and the top layer. In the absence of an etching stop layer, however, different dielectric materials are required for the bottom layer 2A and the top layer 2B, the bottom layer 2A acting as an etching stop layer during a later etching operation.

Porous or non-porous low-k materials having a thickness of 100 to 1000 nanometers are preferably used as materials for the first insulating layer 2 with the bottom layer 2A and the top layer 2B. In particular, FSG (Fluorosilicate glass), OSG (Organosilicate glass), but also $SiO_2$ or SiCOH or the interlayer dielectric known by the product name "Black Diamond" can be used.

Figure 1:
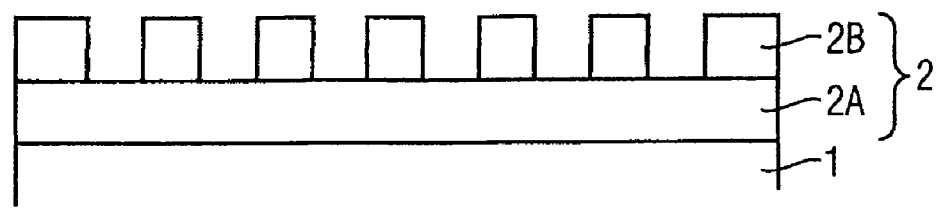
FIGS. 1 to 5D show simplified sectional views and associated plan views for illustrating essential method steps in the production of a capacitor arrangement.

Using a known damascene method (single or dual damascene method), depressions are then introduced into the top layer 2B by means of etching, in which case, using the additional etching stop layer or the bottom layer 2A acting as an etching stop layer, the depressions or trenches illustrated in FIG. 1 are formed in the top layer 2B as far as the etching stop layer. At this point in time, it is furthermore also possible to form passage holes, or so-called contact vias that are not illustrated in the bottom layer 2A, which are suitable for making contact with interconnects lying on the carrier substrate 1 or metal tracks situated more deeply in lower BEOL metal levels.

Figure 2A:
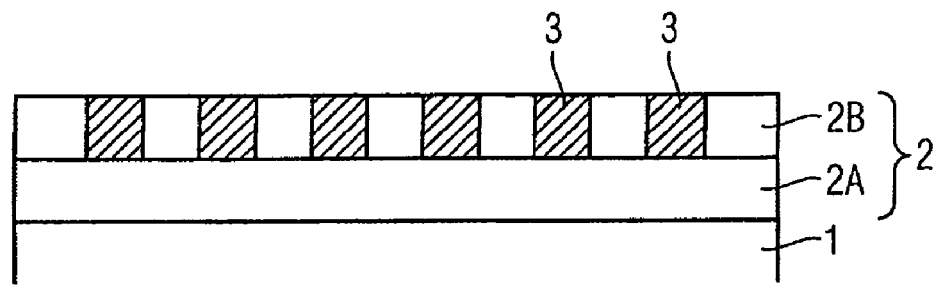

In accordance with FIG. 2A, the depressions or vias (not illustrated) are subsequently filled by means of an electrically conductive material once again in accordance with the known damascene method. By way of example, in this case firstly a so-called liner layer is formed at the surface of the depressions or trenches, onto which metallic material is then deposited for the purpose of realizing interspaced first interconnects 3. The first interconnects 3 are thus formed only within the top layer 2B. By way of example, by means of a PVD (Physical Vapor Deposition) or sputtering method, by means of CVD (Chemical Vapor Deposition), by means of ALCVD (Atomic Layer CVD) or by means of electroplating or by means of electroless deposition (e-less plating), Cu, Al, Ag or some other metallic highly conductive material is deposited within the trenches and subsequently planarized for example by means of a CMP (Chemical Mechanical Polishing) method or by means of an electro-polish method for the purpose of producing a planar or level surface.

In order to avoid an outdiffusion of undesirable metal ions, a diffusion barrier layer (not illustrated) may furthermore additionally be deposited over the whole area at the surface. Moreover, such a diffusion barrier layer may also be situated at the surface of the trenches once again for the purpose of avoiding an outdiffusion of metal ions. Whole-area diffusion barriers are usually dielectric layers, for example $Si_3N_4$, SiC or SiCN. As an alternative, it is also possible to use selectively deposited metallic barriers, for example CoWP, CoWB, NiMoP through selective electroless plating (e-less plating) or W, which can be deposited selectively by means of a CVD method. Together with the liner, such a selective metallic diffusion barrier over the interconnect completely encloses the interconnect metal and protects the latter during the further process steps. The aspect ratio (AR) of the interconnects 3 preferably lies within a range of 1 to 2, where a height of the interlayer dielectric or of the top layer 2B is 100 to 1000 nanometers.

Figure 2B:
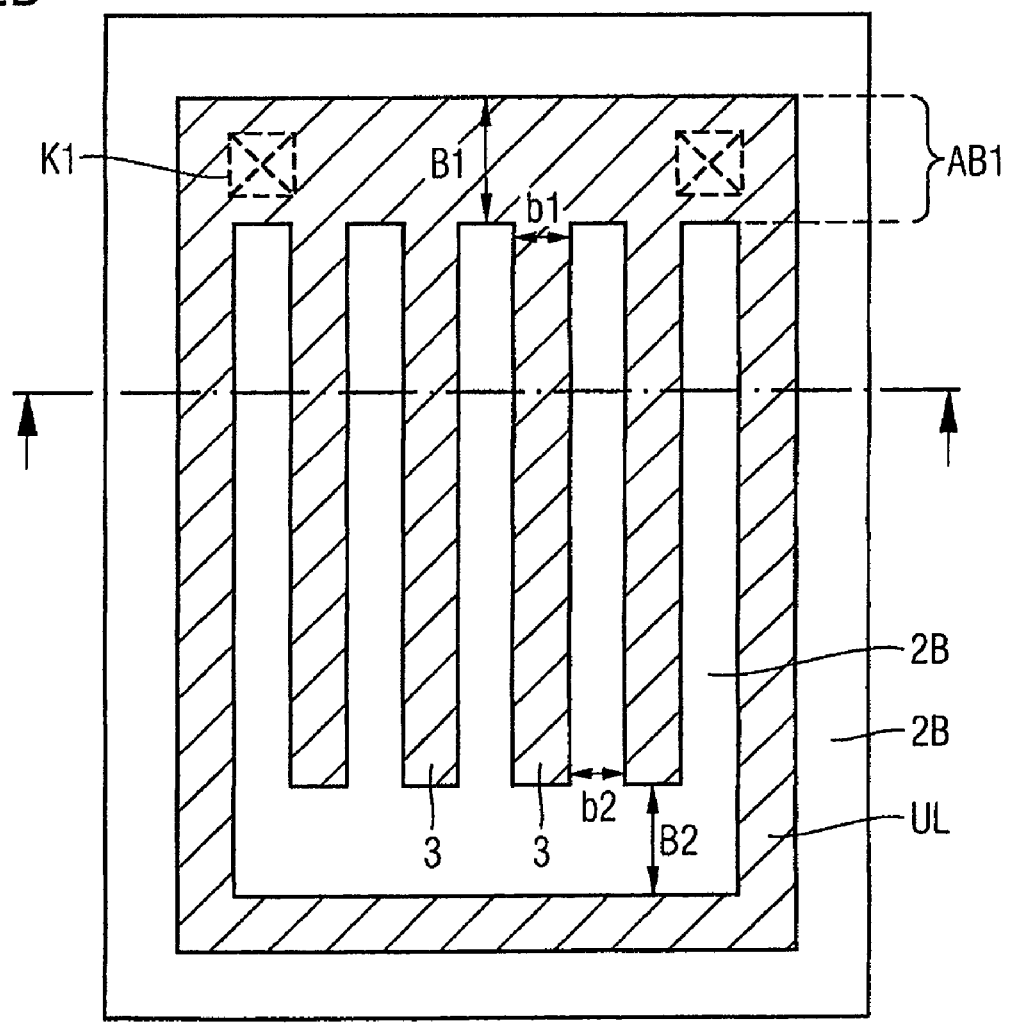

FIG. 2B shows a simplified plan view of the capacitor arrangement in accordance with the method step illustrated in FIG. 2A, identical reference symbols designating identical or corresponding elements and a repeated description being dispensed with below.

In accordance with FIG. 2B, the first capacitor electrode E1 is formed with its interspaced first interconnects 3 by the first connection region AB1, the width B1 is greater than the width of a contact K1 or associated via region VB1; in this case, the connection region AB1 connects a multiplicity of first interconnects 3 in such a way that a comb-shaped structure results. On account of the widened first connection region, improved connection possibilities result in particular for the positioning of the contacts K1 extending to other metalization levels and/or to the carrier substrate 1. Furthermore, the first capacitor electrode E1 in accordance with FIG. 2B has a peripheral interconnect UL surrounding the first interconnects 3, at least one partial section of the peripheral interconnect UL being at a distance B2 from the first interconnects 3 which is greater than the width of a contact K2 or associated via region VB2. By means of said peripheral interconnect UL, the form of the second capacitor electrode that is to be formed later can be defined in self-aligning fashion in a particularly simple manner, the distance B2 again enabling a second connection region for the later second capacitor electrode E2 for the realization of simplified contact-connection.

In accordance with FIG. 2B, the connection regions for the first and second capacitor electrodes lie opposite one another, but they may also be formed at the sides or in a central region. Moreover, the first interconnects 3 are formed essentially parallel to one another and in rectilinear fashion. However, they may in the same way also be formed in meandering, zigzag, cross-lattice-shaped fashion or in some other way, in order to produce a largest possible capacitor area.

Figure 3A:
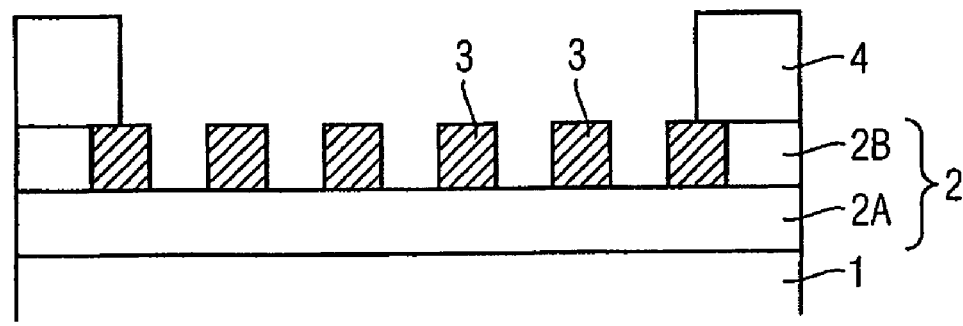
Figure 3B:
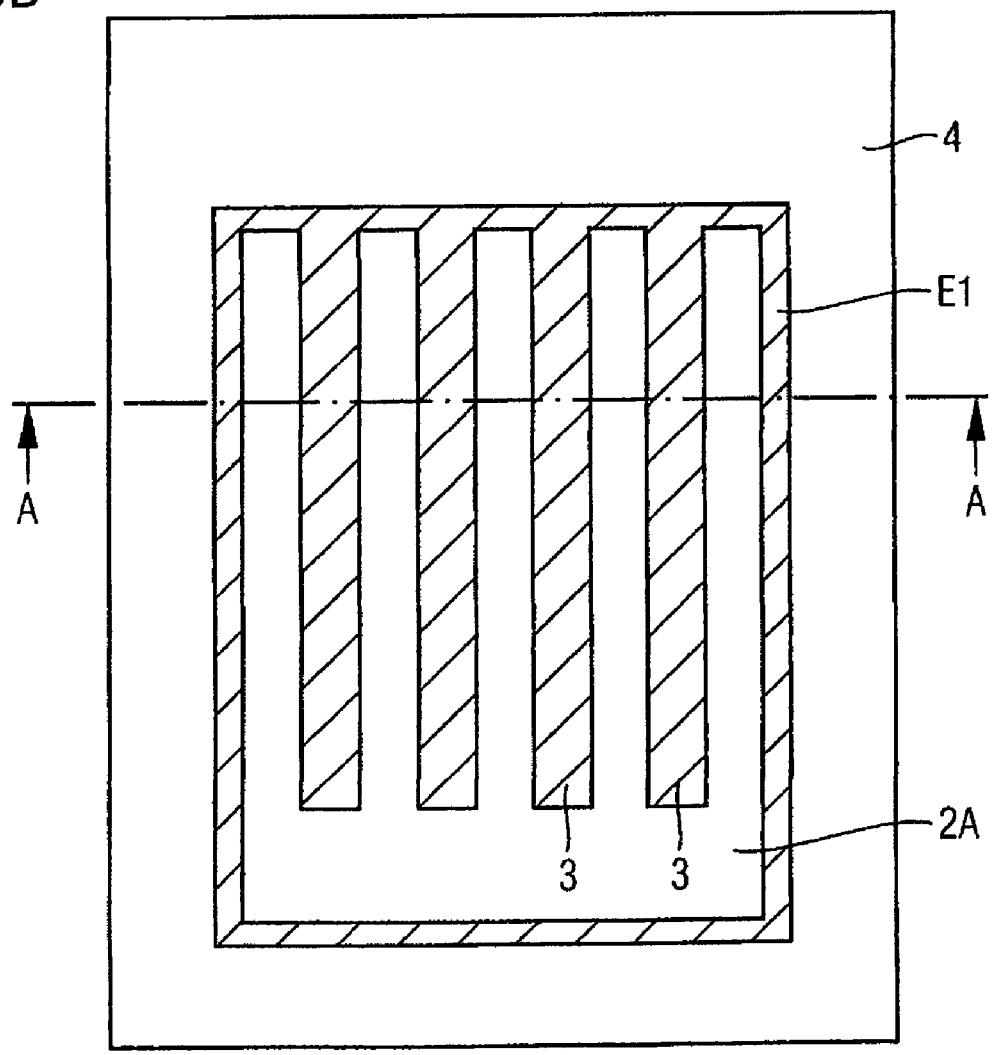

In accordance with FIG. 3A, a mask layer 4 is then formed directly at the surface of the first capacitor electrode E1, or the first interconnects 3 thereof, and a first insulating layer, or the top layer 2B, for the purpose of uncovering at least partial regions of the first insulating layer 2, or the top layer 2B, between the multiplicity of first interconnects 3. To put it more precisely, in accordance with FIG. 3B, which illustrates a plan view of the capacitor arrangement at this point in time, the mask layer 4 is formed with a window region over the capacitor electrode E1 in such a way that it enables a removal of the top layer or the upper region of the first insulating layer 2 as far as the bottom layer 2A or the etching stop layer that is integrated or formed thereon. Preferably, the window region of the mask layer 4 is arranged over the first capacitor electrode E1 in such a way that in each case part of the peripheral interconnect UL and also the first interconnects 3 are completely uncovered, while the connection region AB and other regions of the semiconductor wafer or of the workpiece to be processed remain covered.

Said mask layer 4 is then used to effect removal of the uncovered partial regions of the insulating layer 2 or the top layer 2B for the purpose of uncovering the first interconnects 3 and in particular for the purpose of uncovering the lateral areas of the first interconnects 3 and also the inner lateral areas of the peripheral interconnect UL. By way of example, for this purpose a photoresist is spun on over the whole area, exposed and developed in order to realize the window illustrated.

The removal of the first insulating layer or top layer 2B lying between the first interconnects 3 is effected for example using an HF wet etching method if $SiO_2$ is used as the etching stop layer or as the bottom layer 2A. In principle, however, it is also possible to employ dry etching methods having a sufficient selectivity with respect to the material of the first interconnects 3 used and also with respect to the etching stop layer or the bottom layer 2A. Finally, the mask layer 4 is removed again for example by means of resist stripping.

Figure 4A:
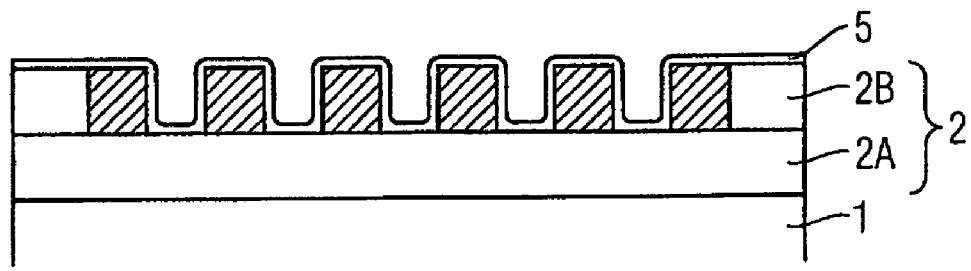

In accordance with FIG. 4A, a capacitor dielectric 5 is then formed at least at the surface of the first interconnects 3 that have been uncovered in this way. By way of example, by means of a deposition method, a capacitor dielectric having a thickness of 5 to 50 nanometers is deposited conformally at the uncovered surface, that is to say at the lateral areas and also the end area of the first interconnects 3 and also at the uncovered regions of the etching stop layer (not illustrated) or the bottom layer 2A. In this case, the thickness of the capacitor dielectric should be chosen such that the depressions or trenches are not filled. In order to realize capacitors having a very high capacitance per unit area, so-called high-k dielectrics and in particular $Al_2O_3$, $HfO_2$ or SiC are suitable as capacitor dielectric 5. In principle, however, it is also possible to use silicon dioxide or silicon nitride.

By way of example, PVD (sputtering), CVD (Chemical Vapor Deposition), ALCVD (Atomic Layer CVD), etc. may be used as deposition methods.

Figure 4B:
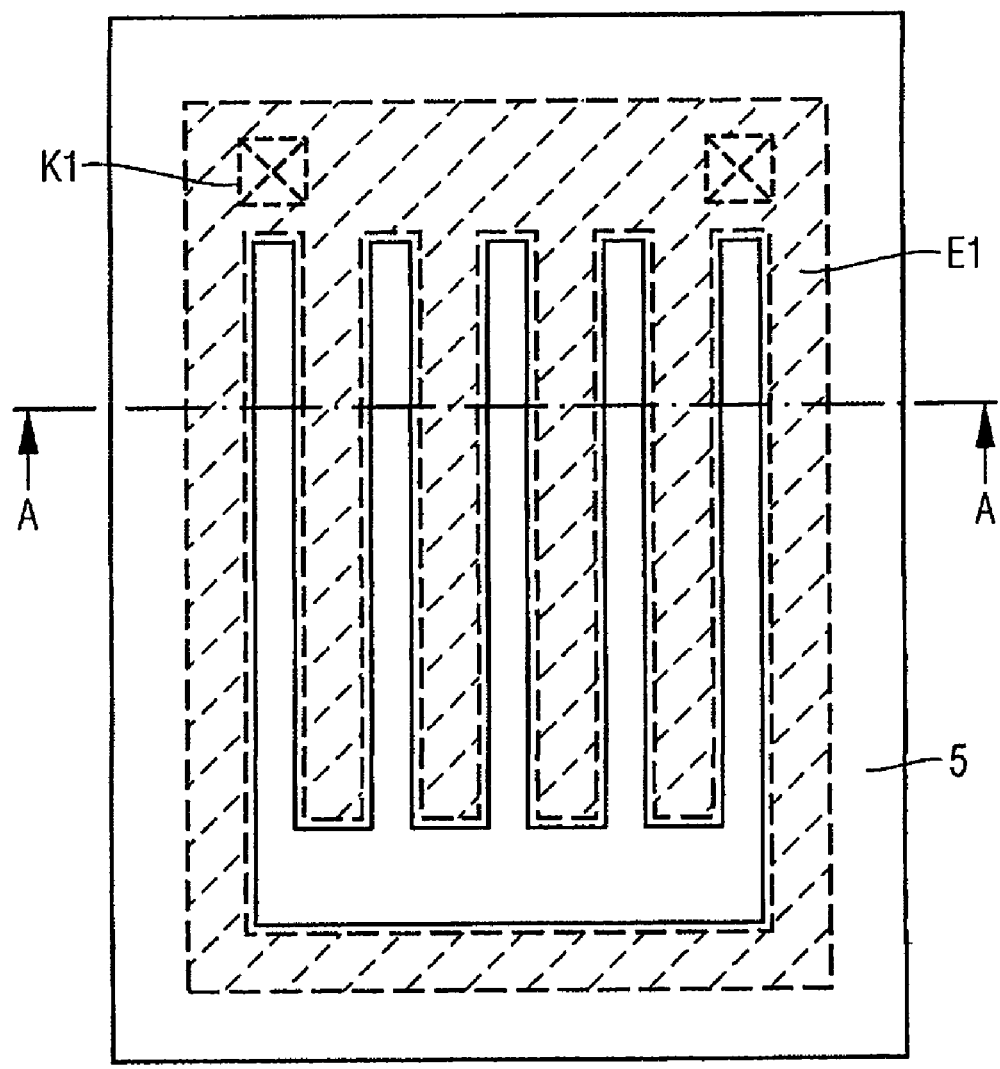

FIG. 4B in turn shows a plan view of the capacitor arrangement as it is present at this point in time.

Figure 5A:
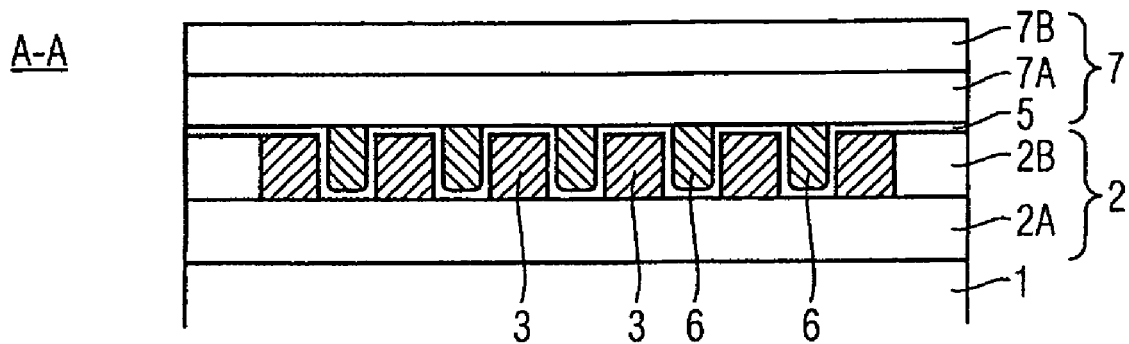

In accordance with FIG. 5A, the capacitor arrangement is then completed, in which case a further electrically conductive material and in particular a metallic material is then introduced into the depressions or trenches coated with the capacitor dielectric 5, for the purpose of realizing a second capacitor electrode E2 with a multiplicity of interspaced second interconnects 6 lying between the first interconnects 3. A deposition method such as, for example, CVD or PVD for depositing a metallic material and in particular Cu is once again used for this purpose, but Cu plating or a plating method is also possible.

Finally, a planarization such as a CMP method, for example, is effected in order to remove the material projecting beyond the capacitor dielectric 5, thereby resulting in a self-aligning patterning of the second capacitor electrode E2 using the first capacitor electrode structure. Wet or dry etching methods may also be used for planarization provided that the second interconnects 6 have very small feature sizes.

Figure 5B:
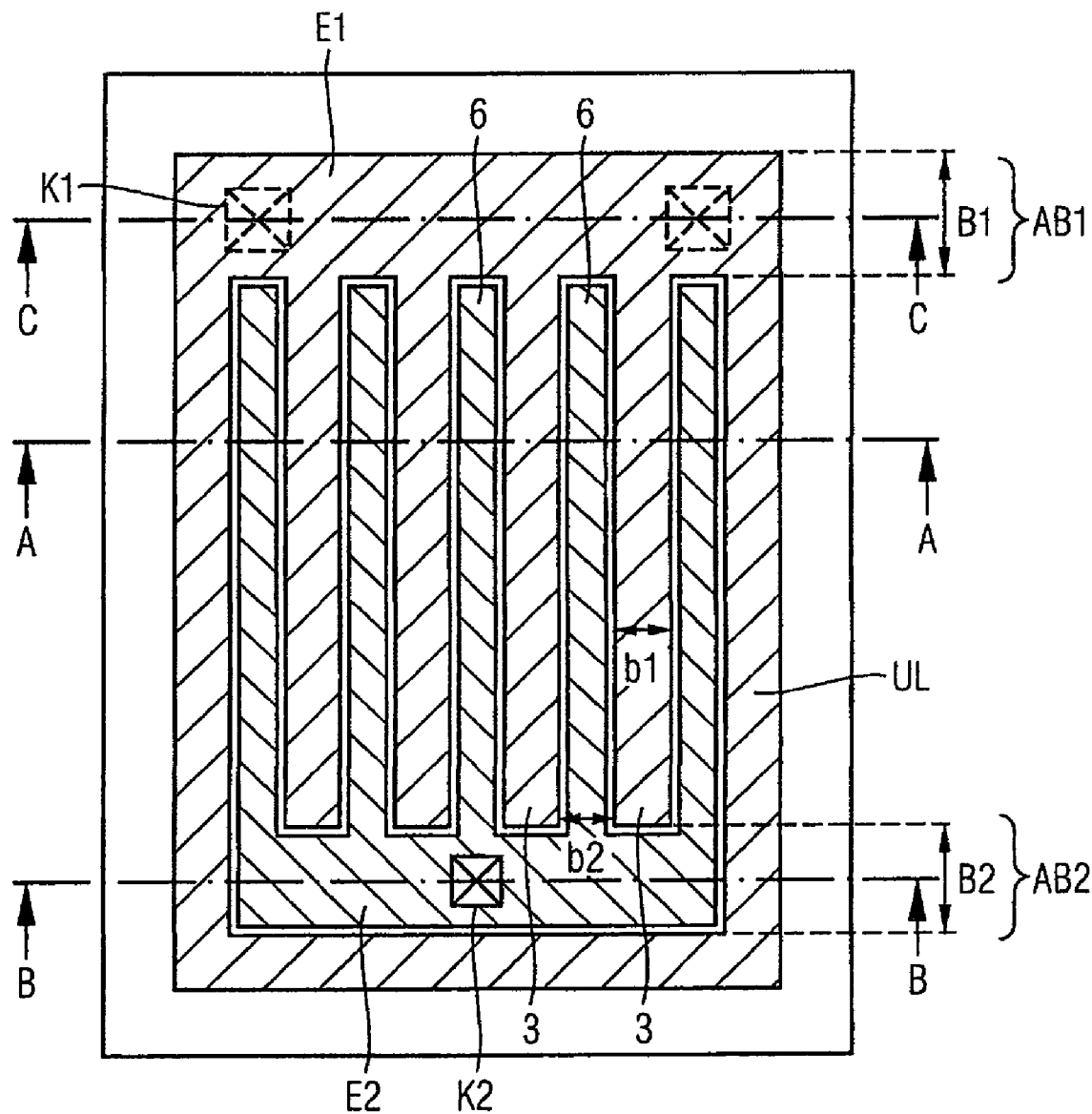

FIG. 5B in turn shows a simplified plan view of the capacitor arrangement according to the invention at this point in time of production, identical reference symbols designating identical or corresponding elements and a repeated description being dispensed with below.

Figure 5C:
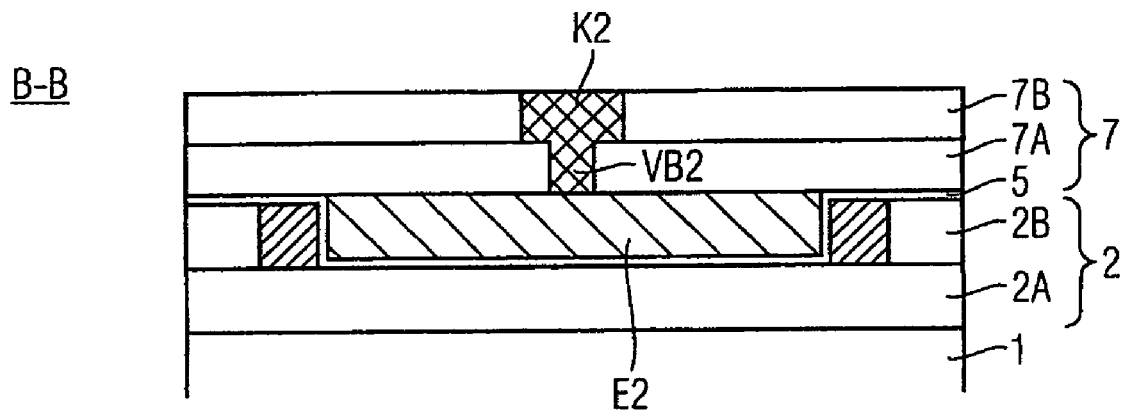
Figure 5D:
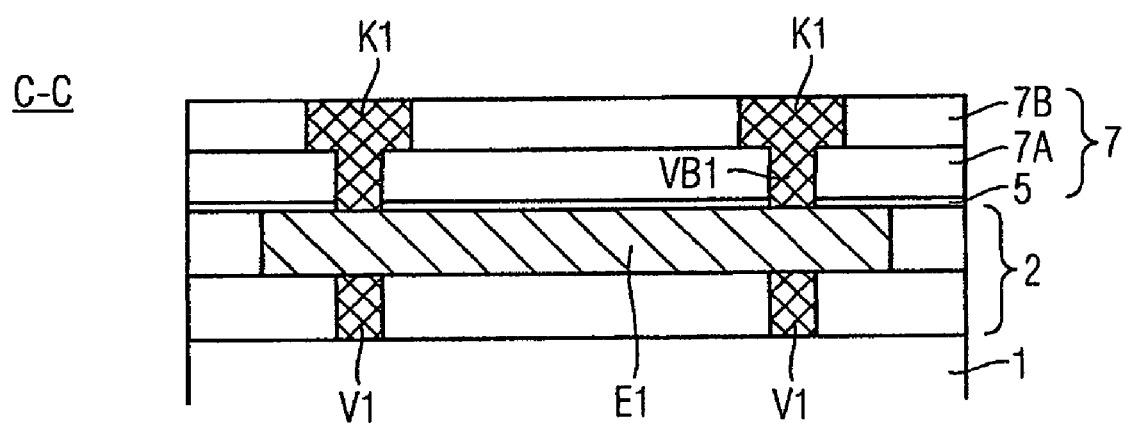

FIGS. 5A, 5C and 5D show the respective sectional views of the sections A/A, B/B and C/C illustrated in FIG. 5B.

Optionally, it is subsequently possible for a protective layer (not illustrated) to be deposited preferably over the whole area, which layer, for example as a diffusion barrier layer, reliably prevents an outdiffusion of metal ions into adjoining regions.

In order to complete the capacitor arrangement, a second insulating layer 7 is formed in a customary manner at the surface of the capacitor dielectric or the second interconnects 6, usually the materials of the BEOL process again being used and typical interlayer dielectrics being employed. In this case, the second insulating layer 7 may again comprise a bottom layer 7A and a top layer 7B, through which it is possible to form, in accordance with FIGS. 5C and 5D, the still required contacts K1 with their via regions VB1 and also the contact K2 with its via region VB2 for the capacitor electrodes. Furthermore, vias V1 may optionally conductively connect the first capacitor electrode E1 to structures of the carrier substrate 1 or to more deeply situated BEOL metal levels (not shown).

This formation of contacts or vias is generally known, for which reason a detailed description is dispensed with below. In this way, with a very simple method, a capacitor arrangement having a high capacitance per unit area is obtained which is formed in self-aligning fashion and, moreover, is very stable mechanically, which is important particularly when using porous or non-porous low-k materials. In this case, the capacitor or the capacitor arrangement is formed entirely in just a single metalization level and thus has a minimal height. Contact can be made with the capacitor electrodes particularly simply by means of the spacious connection regions of underlying and/or overlying metalization levels.

The invention has been described above on the basis of a BEOL-MIMCap formed in a lower metalization level. However, it is not restricted thereto and in the same way also encompasses alternative capacitor arrangements that use alternative materials. Furthermore, the capacitor arrangement has been described on the basis of specific high-k materials for the capacitor dielectric. However, it is not restricted thereto and in the same way also encompasses alternative materials for the capacitor dielectric.

The invention claimed is:

1. A capacitor arrangement comprising:
   a first capacitor electrode having a multiplicity of interspaced first interconnects;
   a capacitor dielectric formed at the surface of the first interconnects;
   a second capacitor electrode having a multiplicity of interspaced second interconnects formed on the capacitor dielectric and between the first interconnects;
   wherein the first and second capacitor electrodes are formed in a top layer of a first insulating layer, the top layer being formed on a bottom layer with an etching stop layer; and
   wherein the bottom layer and the top layer of the first insulating layer have an identical material with an intervening additional etching stop layer.

2. A capacitor arrangement comprising:
   a first capacitor electrode having a multiplicity of interspaced first interconnects;
   a capacitor dielectric formed at the surface of the first interconnects;
   a second capacitor electrode having a multiplicity of interspaced second interconnects formed on the capacitor dielectric and between the first interconnects;
   wherein the first and second capacitor electrodes are formed in a top layer of a first insulating layer, the top layer being formed on a bottom layer with an etching stop layer; and
   wherein the first capacitor electrode is formed in comb-shaped fashion with a peripheral interconnect surrounding the first interconnects, at least one partial section of the peripheral interconnect being at a distance from the first interconnects, the distance being greater than the width of a contact or a via region.

3. The capacitor arrangement as claimed in claim 1, wherein the first interconnects are formed in a rectilinear, meandering, zigzag or cross-lattice-shaped fashion.

4. The capacitor arrangement as claimed in claim 1, wherein the capacitor arrangement is a BEOL-MIMCap.

5. The capacitor arrangement as claimed in claim 1, wherein the first and second capacitor electrodes are formed in a bottommost metalization level of an integrated semiconductor circuit arrangement.

6. The capacitor arrangement as claimed in claim 1, wherein:
   the first insulating layer has a porous or a non-porous low-k material, in particular FSG or OSG, and/or $SiO_2$;
   the first and second capacitor electrodes have Cu, Al and/or Ag; and
   the capacitor dielectric has a high-k material, in particular $Al_2O_3$, $HfO_2$ or SiC.

* * * * *

UNITED STATES PATENT AND TRADEMARK OFFICE
CERTIFICATE OF CORRECTION

| | | |
|---|---|---|
| PATENT NO. | : 7,635,908 B2 | Page 1 of 1 |
| APPLICATION NO. | : 11/652157 | |
| DATED | : December 22, 2009 | |
| INVENTOR(S) | : Barth et al. | |

It is certified that error appears in the above-identified patent and that said Letters Patent is hereby corrected as shown below:

Title Pg, insert -- (30): Foreign Application Priority Data

Jul. 13, 2004 (DE) ...................................... 10 2004 033 825.6 --.

Signed and Sealed this
Twenty-fourth Day of April, 2012

David J. Kappos
*Director of the United States Patent and Trademark Office*